(12) United States Patent
Soma et al.

(10) Patent No.: US 11,940,465 B2
(45) Date of Patent: Mar. 26, 2024

(54) CONTACT PROBE AND SIGNAL TRANSMISSION METHOD

(71) Applicant: NHK Spring Co., Ltd., Yokohama (JP)

(72) Inventors: Kazuya Soma, Kanagawa (JP);
Masahiro Takahashi, Kanagawa (JP);
Shuji Takahashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 114 days.

(21) Appl. No.: 17/437,152

(22) PCT Filed: Mar. 12, 2020

(86) PCT No.: PCT/JP2020/010960
§ 371 (c)(1),
(2) Date: Sep. 8, 2021

(87) PCT Pub. No.: WO2020/184684
PCT Pub. Date: Sep. 17, 2020

(65) Prior Publication Data
US 2022/0146552 A1   May 12, 2022

(30) Foreign Application Priority Data

Mar. 13, 2019 (JP) ................................ 2019-046149

(51) Int. Cl.
*G01R 1/073* (2006.01)
*H01R 12/71* (2011.01)
*H01R 13/24* (2006.01)

(52) U.S. Cl.
CPC ..... *G01R 1/07307* (2013.01); *H01R 13/2421* (2013.01); *H01R 12/714* (2013.01); *H01R 2201/20* (2013.01)

(58) Field of Classification Search
CPC ............ G01R 1/07307; H01R 13/2421; H01R 12/714; H01R 2201/20
See application file for complete search history.

(56) References Cited

U.S. PATENT DOCUMENTS 6,337,572 B1   1/2002   Kazama
8,975,906 B2   3/2015   Jeong
(Continued)

FOREIGN PATENT DOCUMENTS

CN   102959406 A   3/2013
CN   106574937 A   4/2017
(Continued)

OTHER PUBLICATIONS

Office Action dated Sep. 24, 2021, issued for Taiwan patent application No. 109108389 and English translation of the Search Report.
(Continued)

*Primary Examiner* — Paresh Patel
(74) *Attorney, Agent, or Firm* — Locke Lord LLP

(57) ABSTRACT

A contact probe includes a first plunger, a second plunger, a coil spring, and a pipe; the first plunger includes a first slide portion that slides along the inner periphery of the pipe; the second plunger includes a second slide portion that slides along the inner periphery of the pipe; and the coil spring includes: a first attachment portion that is attached to the first plunger and tightly wound; a second attachment portion that is attached to the second plunger and tightly wound; a coarsely wound portion; a first contact portion including one end connected to the first attachment portion and another end connected to the coarsely wound portion and contacting the pipe; and a second contact portion including one end connected to the coarsely wound portion and another end connected to the second attachment portion and contacting to the pipe.

4 Claims, 5 Drawing Sheets

(56) References Cited

U.S. PATENT DOCUMENTS

| | | | |
|---|---|---|---|
| 11,131,691 | B2 | 9/2021 | Sakaguchi et al. |
| 11,394,148 | B2 * | 7/2022 | Iwasaki .............. H01R 13/2492 |
| 2006/0220666 | A1 | 10/2006 | Kazama |
| 2009/0146672 | A1 | 6/2009 | Nakamura |
| 2012/0105090 | A1 * | 5/2012 | Lee .................... G01R 1/06722 |
| | | | 324/755.05 |
| 2013/0069684 | A1 | 3/2013 | Jeong |
| 2013/0099814 | A1 | 4/2013 | Kazama et al. |
| 2015/0160265 | A1 | 6/2015 | Nakamura et al. |
| 2015/0285840 | A1 | 10/2015 | Matsui et al. |
| 2017/0229802 | A1 | 8/2017 | Kazama et al. |
| 2018/0335447 | A1 | 11/2018 | Yamamoto |
| 2021/0223287 | A1 | 7/2021 | Souma et al. |
| 2022/0252640 | A1 | 8/2022 | Souma et al. |

FOREIGN PATENT DOCUMENTS

| | | |
|---|---|---|
| JP | 2003-172748 A | 6/2003 |
| JP | 2011-169595 A | 9/2011 |
| JP | 2011-180034 A | 9/2011 |
| JP | 2015-227845 A | 12/2015 |
| JP | 2016-008904 A | 1/2016 |
| JP | 2017-142138 A | 8/2017 |
| JP | 2017-224632 A | 12/2017 |
| KR | 10-2001-0021666 A | 3/2001 |
| KR | 10-2008-0079585 A | 9/2008 |
| KR | 10-2009-0099157 A | 9/2009 |
| KR | 10-2015-0002696 A | 1/2015 |
| KR | 10-2016-0063825 A | 6/2016 |
| KR | 10-2018-0126387 A | 11/2018 |
| TW | I554762 B | 10/2016 |
| TW | I683107 B | 1/2020 |
| WO | 2013/051675 A1 | 4/2013 |
| WO | 2018/181776 A1 | 10/2018 |

OTHER PUBLICATIONS

Office Action dated Apr. 23, 2023, issued for the corresponding Chinese patent application No. 202080019973.3 and English translation thereof.

Office Action dated Jul. 17, 2023, issued for the Korean patent application No. 10-2021-7028030 and English machines translation thereof.

Decision for Grant dated Oct. 31, 2023, issued for KR10-2021-7028030 and English translation thereof.

* cited by examiner

CONTACT PROBE AND SIGNAL TRANSMISSION METHOD

FIELD

The present invention relates to a probe unit housing contact probes that input and output signals from and to predetermined circuit structures.

BACKGROUND

In performing an electrical continuity test or an operation characteristic test on a test target, such as a semiconductor integrated circuit or a liquid crystal panel, a probe unit including plural contact probes and a probe holder housing the plural contact probes has been conventionally used to electrically connect between the test target and a signal processing device that outputs a test signal (see, for example, Patent Literature 1). A conventional contact probe disclosed in Patent Literature 1 includes a first plunger that comes into contact with a test target, a second plunger that comes into contact with an electrode of a signal processing device, a coil spring that connects the first and second plungers to each other, and an electrically conductive pipe provided inside the coil spring. The first and second plungers are capable of sliding along the pipe, inside the pipe. In this contact probe, the first plunger and coil spring, and the coil spring and second plunger are electrically connected, by sliding along (contacting) the pipe.

CITATION LIST

Patent Literature

Patent Literature 1: Japanese Unexamined Patent Application, Publication No. 2011-169595

SUMMARY

Technical Problem

However, the contact between the plungers and the pipe may sometimes be unstable due to inclination of the plungers, for example. When the contact between the plungers and the pipe is not stabilized, electrical continuity for test signals is not stabilized either.

The present invention has been made in view of the above, and an object of the present invention is to provide a contact probe and a signal transmission method that enable stable electrical conduction of signals in contact probes.

Solution to Problem

To solve the above-described problem and achieve the object, a contact probe according to the present invention for contacting with electrodes at both ends of a longitudinal length of the contact probe and transmitting a signal, includes: a first plunger configured to contact a first electrode at one end of the longitudinal length; a second plunger configured to contact a second electrode different from the first electrode at another end of the longitudinal length; a coil spring connected to the first plunger at one end of the coil spring and connected to the second plunger at another end of the coil spring; and a pipe provided inside the coil spring, wherein the first plunger includes a first slide portion provided at another end of the first plunger opposite to the one end of the first plunger contacting the first electrode, the first slide portion being configured to slide along an inner periphery of the pipe, the second plunger includes a second slide portion provided at another end of the second plunger opposite to the one end of the second plunger contacting the second electrode, the second slide portion being configured to slide along the inner periphery of the pipe, and the coil spring includes: a first attachment portion that is tightly wound, the first attachment portion being provided at the one end of the coil spring and attached to the first plunger; a second attachment portion that is tightly wound, the second attachment portion being provided at the other end of the coil spring and attached to the second plunger; a coarsely wound portion wound at preset pitches; a first contact portion including one end connected to the first attachment portion and another end connected to the coarsely wound portion, the first contact portion contacting the pipe; and a second contact portion including one end connected to the coarsely wound portion and another end connected to the second attachment portion, the second contact portion contacting the pipe.

Moreover, in the above-described contact probe according to the present invention, in a natural state where no load other than gravity is being applied to the contact probe, the first slide portion and the second slide portion are positioned inside the pipe regardless of a position of the pipe along an axial direction of the contact probe.

Moreover, a signal transmission method according to the present invention for transmitting a signal, via the contact probe according to the above-described invention, from the second electrode to the first electrode, includes transmitting the signal input from the second electrode to the second plunger to the first electrode via at least one of: a first path through which the signal reaches the first electrode via the second attachment portion, the second contact portion, the pipe, the first contact portion, and the first attachment portion; and a second path through which the signal reaches the first electrode via the second slide portion, the pipe, and the first slide portion.

Advantageous Effects of Invention

The present invention has an effect of enabling stable electrical conduction of signals in contact probes.

DESCRIPTION OF EMBODIMENTS

Modes for implementing the present invention will be described in detail below, together with the drawings. The present invention is not limited by the following embodiments. Furthermore, the figures referred to in the following description just schematically illustrate the shapes, sizes, and positional relations to enable the present invention to be understood, and the present invention is therefore not limited only to the shapes, sizes, and positional relations exemplified by the drawings.

Figure 1:
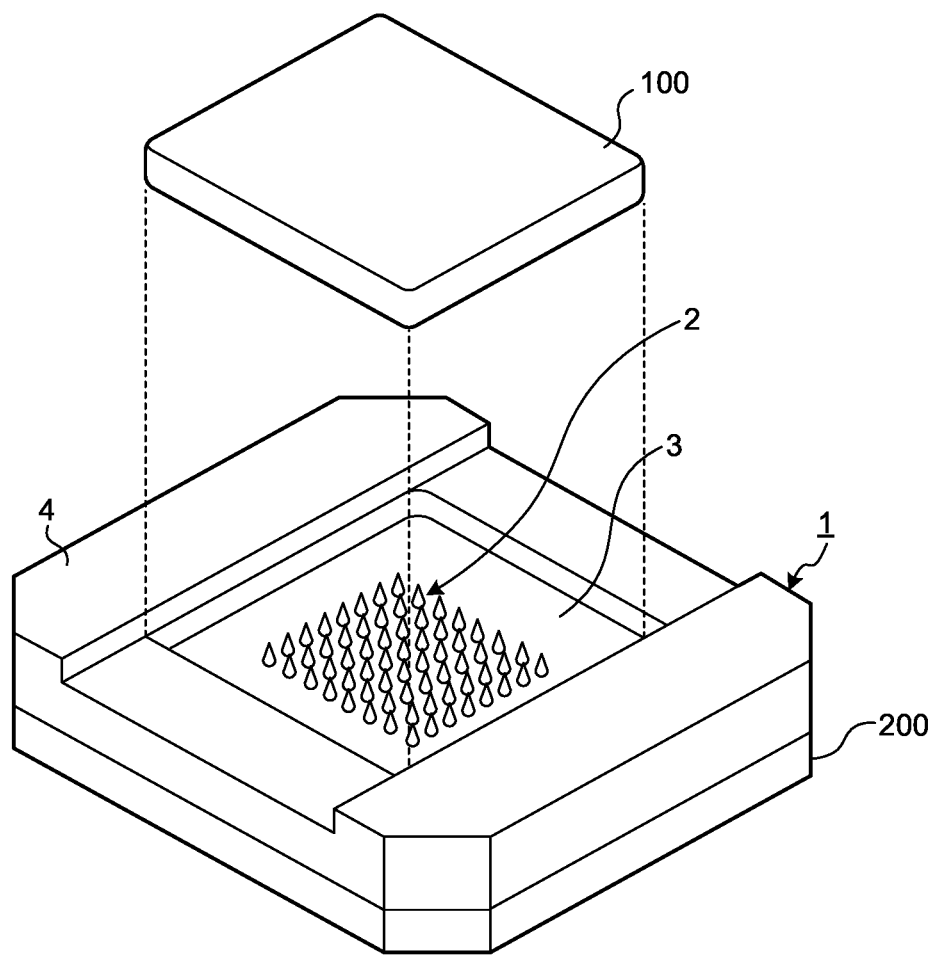
FIG. 1 is a perspective view illustrating a configuration of a probe unit according to an embodiment of the present invention.

FIG. 1 is a perspective view illustrating a configuration of a probe unit according to an embodiment of the present invention. A probe unit 1 illustrated in FIG. 1 is a device used in testing electrical properties of a semiconductor integrated circuit 100 that is a target to be tested, and the probe unit 1 is a device that electrically connects between the semiconductor integrated circuit 100 and a circuit board 200 that outputs a test signal to the semiconductor integrated circuit 100.

The probe unit 1 has: electrically conductive contact probes 2 (hereinafter, simply referred to as "probes 2") that come into contact, at both ends of a longitudinal length of the probes 2, with the semiconductor integrated circuit 100 and the circuit board 200 that are two contacted bodies different from each other; a probe holder 3 that houses and holds the plural probes 2 according to a predetermined pattern; and a holder member 4 that is provided around the probe holder 3 and prevents displacement of the semiconductor integrated circuit 100 that comes into contact with the plural probes 2 when the semiconductor integrated circuit 100 is tested.

Figure 2:
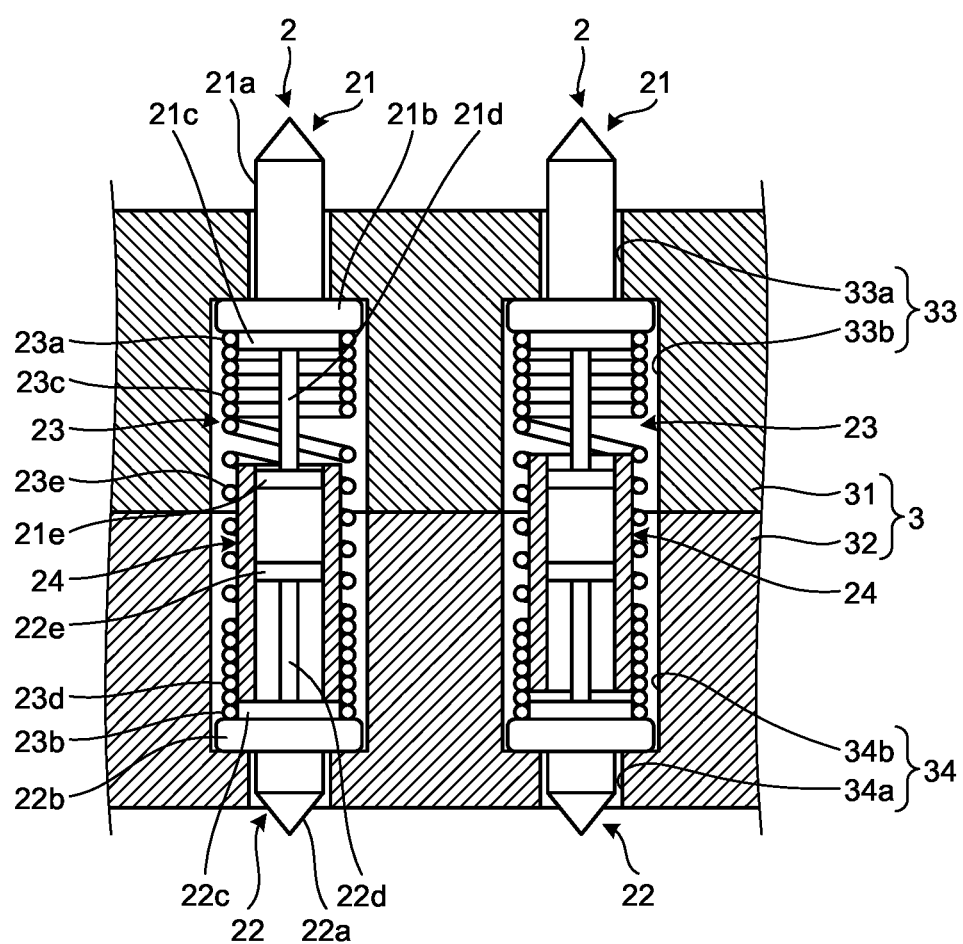
FIG. 2 is a partial sectional view illustrating a configuration of main parts of the probe unit according to the embodiment of the present invention.

FIG. 2 is a partial sectional view illustrating a detailed configuration of the probes 2 housed in the probe holder 3. Each of the probes 2 illustrated in FIG. 2 includes: a first plunger 21 that is formed using an electrically conducting material and comes into contact with an electrode of the semiconductor integrated circuit 100 when the semiconductor integrated circuit 100 is tested; a second plunger 22 that comes into contact with an electrode of the circuit board 200 including a testing circuit; a coil spring 23 that is provided between the first plunger 21 and the second plunger 22 and couples the two first plunger 21 and second plunger 22 together such that the first and second plungers 21 and 22 are capable of expansion and contraction; and a pipe 24 provided inside the coil spring 23. The first plunger 21 and second plunger 22, the coil spring 23, and the pipe 24 that form the probe 2 have the same axis. That is, central axes of the first plunger 21 and second plunger 22, the coil spring 23, and the pipe 24 are positioned on the same straight line. The probes 2 mitigate impact on the electrode of the semiconductor integrated circuit 100 and apply a load to the semiconductor integrated circuit 100 and the circuit board 200 by expanding and contracting in the axial direction when the semiconductor integrated circuit 100 is brought into contact with the probes 2.

The first plunger 21 has: a distal end portion 21a that has a distal end having a tapered shape and comes into contact with the electrode of the semiconductor integrated circuit 100; a flange portion 21b having a diameter larger than a diameter of the distal end portion 21a; a boss portion 21c that extends opposite to the distal end portion 21a with the flange portion 21b interposed between the distal end portion 21a and the boss portion 21c, has a diameter smaller than the diameter of the flange portion 21b, and is where one end portion of the coil spring 23 is pressed into; a proximal end portion 21d that extends opposite to the flange portion 21b with the boss portion 21c interposed between the flange portion 21b and the proximal end portion 21d and has a diameter smaller than the diameter of the boss portion 21c; and a slide portion 21e that is provided opposite to the boss portion 21c with the proximal end portion 21d interposed between the boss portion 21c and the slide portion 21e, slides along the pipe 24, and is disk-shaped. In this embodiment, the slide portion 21e has a diameter smaller than the diameter of the boss portion 21c and larger than the diameter of the proximal end portion 21d. This first plunger 21 is capable of moving in the axial direction by expansion and contraction of the coil spring 23 and comes into contact with the electrode of the semiconductor integrated circuit 100 by being biased towards the semiconductor integrated circuit 100 by elastic force of the coil spring 23.

The second plunger 22 has: a distal end portion 22a that has a distal end having a tapered shape and comes into contact with the electrode of the circuit board 200; a flange portion 22b having a diameter larger than a diameter of the distal end portion 22a; a boss portion 22c that extends opposite to the distal end portion 22a with the flange portion 22b interposed between the distal end portion 22a and the boss portion 22c, has a diameter smaller than the diameter of the flange portion 22b, and is where the other end portion of the coil spring 23 is pressed into; a proximal end portion 22d that extends opposite to the flange portion 22b with the boss portion 22c interposed between the flange portion 22b and the proximal end portion 22d and has a diameter smaller than the diameter of the boss portion 22c; and a slide portion 22e that is provided opposite to the boss portion 22c with the proximal end portion 22d interposed between the boss portion 22c and the slide portion 22e, slides along the pipe 24, and is disk-shaped. In this embodiment, the slide portion 22e has a diameter smaller than the diameter of the boss portion 22c and larger than the diameter of the proximal end portion 22d. This second plunger 22 is capable of moving in the axial direction by expansion and contraction of the coil spring 23 and comes into contact with the electrode of the circuit board 200 by being biased toward the circuit board 200 by elastic force of the coil spring 23. In this embodiment, the diameter of the slide portion 21e and the diameter of the slide portion 22e are the same. In this specification, the term "the same (equivalent)" includes any manufacturing error.

The coil spring 23 has: a first attachment portion 23a that is attached to the boss portion 21c of the first plunger 21 and is tightly wound; a second attachment portion 23b that is attached to the boss portion 22c of the second plunger 22 and is tightly wound; a first contact portion 23c that is connected with the first attachment portion 23a, is capable of coming into contact with one end portion of the pipe 24 at the inner periphery of the first contact portion 23c, and is tightly wound; a second contact portion 23d that is connected with the second attachment portion 23b, is capable of coming into contact with the other end portion of the pipe 24 at the inner periphery of the second contact portion 23d, and is tightly wound; and a coarsely wound portion 23e that is wound at predetermined intervals. One end of the coarsely wound portion 23e is connected with the first contact portion 23c and the other end of the coarsely wound portion 23e is connected with the second contact portion 23d. The coil spring 23 is, for example, formed of an electrically conductive wire that has been wound.

An end portion of the first attachment portion 23a is, for example, pressed into the boss portion 21c of the first plunger 21, to come into contact with the flange portion 21b. An end portion of the second attachment portion 23b, on the other hand, is pressed into the boss portion 22c of the second plunger 22, to come into contact with the flange portion 22b. Furthermore, the first plunger 21 and second plunger 22 are joined to the coil spring 23 by the spring's winding force and/or soldering. The probes 2 expand and contract in the axial direction by expansion and contraction of their coarsely wound portions 23e.

An example in which the numbers of windings of the first attachment portion 23a and first contact portion 23c are the same as the numbers of windings of the second attachment portion 23b and the second contact portion 23d will be described with respect to this embodiment, but their numbers of windings may be different as long as the contact between the first contact portion 23c and the pipe 24 and between the second contact portion 23d and the pipe 24 are able to be achieved.

The diameter of the outer circumference of the pipe 24 is equivalent or slightly smaller than the diameter of the inner circumference of the coil spring 23. Furthermore, the diameter of the inner circumference of the pipe 24 is equivalent to or slightly larger than the diameter of the slide portions 21e and 22e. The pipe 24 is capable of moving along the axial direction between the boss portion 21c and the boss portion 22c. The pipe 24 has a length, in the axial direction, longer than a distance, in the axial direction, between the slide portions 21e and 22e, the distance being in a natural state, and this length is also longer than a longer one of: a distance, in the axial direction, between the slide portion 21e and the boss portion 22c at the time when the first plunger 21 and the second plunger 22 come closer to each other during a test; and a distance between the boss portion 21c and the slide portion 22e at that time. The "natural state" herein refers to a state where no load other than gravity is being applied to that probe 2. The slide portions 21e and 22e are positioned inside the pipe 24 in this natural state (for example, see FIG. 5 described later). The length, in the axial direction, of the pipe 24 is preferably a length by which the slide portions 21e and 22e are positioned inside the pipe 24 no matter where the pipe 24 is placed between the boss portions 21c and 22c in the axial direction. If the diameter of the outer circumference of the pipe 24 is different from the diameter of the inner circumference of the coil spring 23, the diameter of the outer circumference of the pipe 24 is smaller than the diameter of the inner circumference of the coil spring 23 such that the coil spring 23 (the first contact portion 23c and the second contact portion 23d) is capable of sliding along the pipe 24. Furthermore, if the diameter of the inner circumference of the pipe 24 is different from the diameter of the slide portions 21e and 22e, the diameter of the inner circumference of the pipe 24 is larger than the diameter of the slide portions 21e and 22e such that the slide portions 21e and 22e are capable of sliding along the pipe 24.

The probe holder 3 is formed using an insulating material, such as resin, machinable ceramic, or silicone, and is formed of a first member 31 positioned upper in FIG. 2 and a second member 32 positioned lower in FIG. 2 that are layered over each other. The first member 31 and second member 32 respectively have the same numbers of holder holes 33 and 34 formed therein for housing the plural probes 2, and the holder holes 33 and 34 housing the probes 2 are formed such that the axes of the holder holes 33 and 34 are aligned with each other. Positions at which the holder holes 33 and 34 are formed are determined according to a wiring pattern of the semiconductor integrated circuit 100.

The holder holes 33 and 34 both have stepped hole shapes that each differ, along a penetrating direction of the hole shape, in diameter. That is, the holder hole 33 is formed of: a small diameter portion 33a having an opening at an upper end surface of the probe holder 3; and a large diameter portion 33b having a diameter larger than that of this small diameter portion 33a. The holder hole 34, on the other hand, is formed of: a small diameter portion 34a having an opening at a lower end surface of the probe holder 3; and a large diameter portion 34b having a diameter larger than that of this small diameter portion 34a. Shapes of these holder holes 33 and 34 are determined according to a configuration of the probes 2 housed therein. The flange portion 21b of the first plunger 21 has a function of preventing the probe 2 from escaping from the probe holder 3 by coming into contact with a boundary wall surface between the small diameter portion 33a and large diameter portion 33b of the holder hole 33. Furthermore, the flange portion 22b of the second plunger 22 has a function of preventing the probe 2 from escaping from the probe holder 3 by coming into contact with a boundary wall surface between the small diameter portion 34a and large diameter portion 34b of the holder hole 34.

Figure 3:
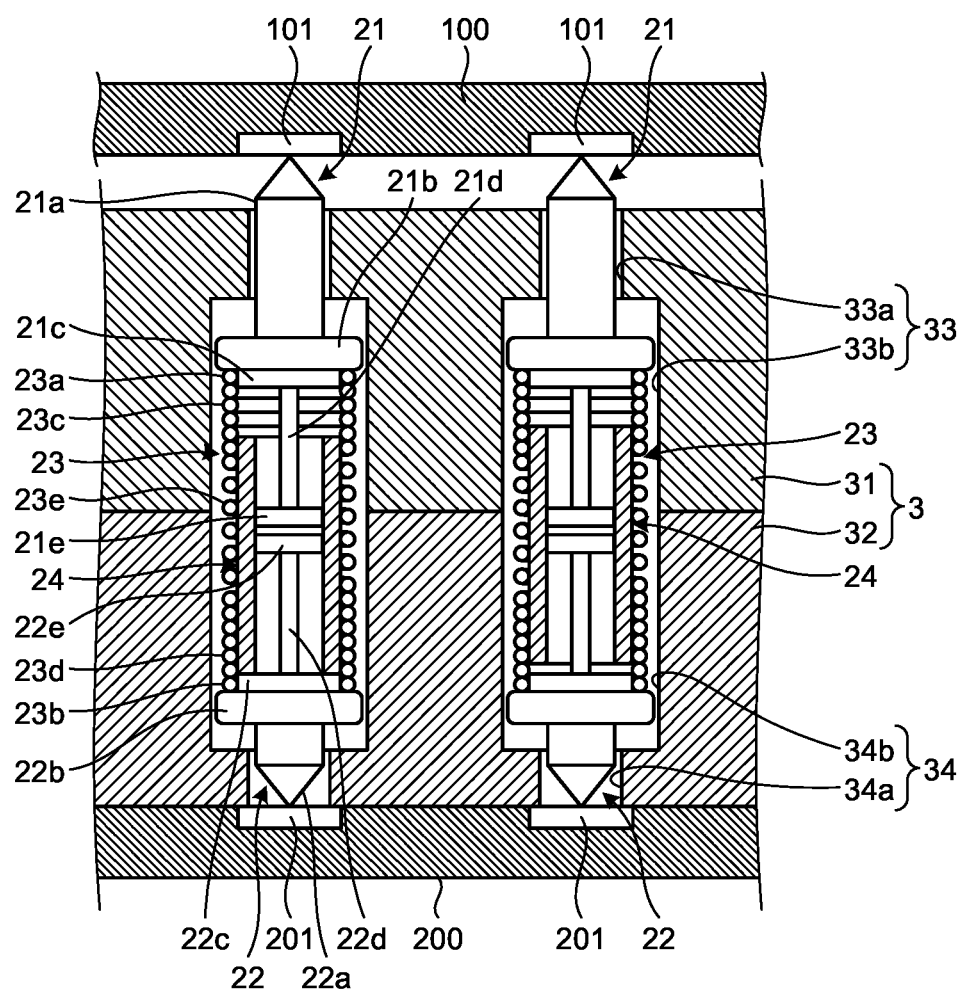
FIG. 3 is a partial sectional view illustrating a configuration of main parts of the probe unit upon testing of a semiconductor integrated circuit.

FIG. 3 is a diagram illustrating a state of the semiconductor integrated circuit 100 in a test using the probe holder 3. When the semiconductor integrated circuit 100 is tested, the coil spring 23 is brought into a state of being compressed along a longitudinal direction thereof by a contact load from the semiconductor integrated circuit 100. When the coil spring 23 is compressed, pitches in the coarsely wound portion 23e are decreased. As this happens, the slide portion 21e of the first plunger 21 and the slide portion 22e of the second plunger 22 slide along the inner peripheral surface of the pipe 24. Electrical conduction is surely achieved by the slide portion 21e, the slide portion 22e, the first contact portion 23c, and the second contact portion 23d each coming into contact with the pipe 24. At that time, because the slide portions 21e and 22e are in contact with the pipe 24, the axis of the second plunger 22 is not significantly shifted.

A test signal supplied from the circuit board 200 to the semiconductor integrated circuit 100 at the time of testing reaches an electrode 101 of the semiconductor integrated circuit 100 from an electrode 201 of the circuit board 200 via the second plunger 22 of the probe 2, the pipe 24, (the coil spring 23), and the first plunger 21.

Figure 4:
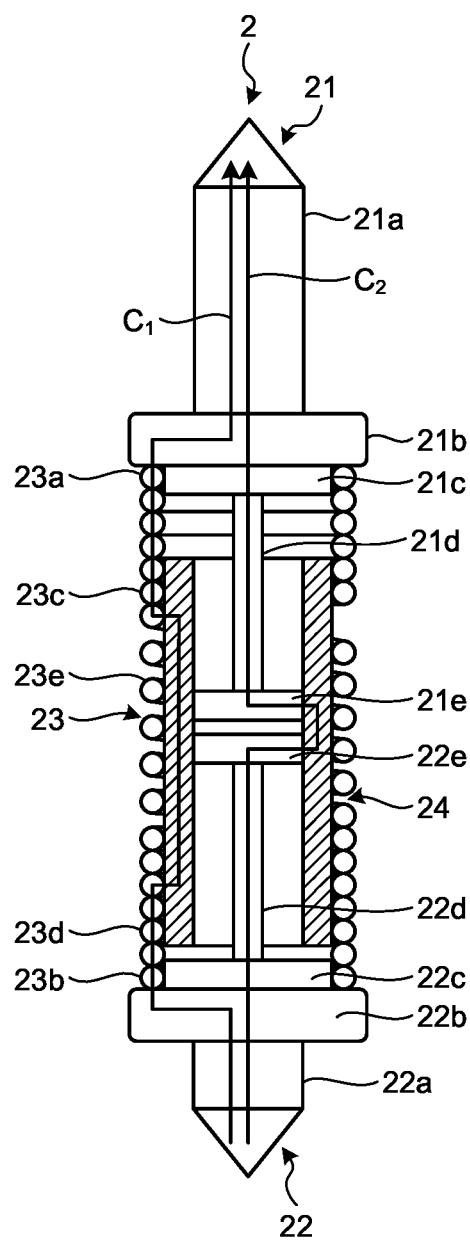
FIG. 4 is a diagram for explanation of conduction paths for a signal electrically conducted through a contact probe upon testing of the semiconductor integrated circuit.

FIG. 4 is a diagram for explanation of conduction paths for a signal electrically conducted through a contact probe upon testing of a semiconductor integrated circuit. In the testing, the signal reaches the electrode 101 via at least one of plural paths. FIG. 4 illustrates an example of the plural paths.

Specifically, through a first path $C_1$, the electrode 101 is reached via the distal end portion 22a, the flange portion 22b, the second attachment portion 23b, the second contact portion 23d, the pipe 24, the first contact portion 23c, the first attachment portion 23a, the flange portion 21b, and the distal end portion 21a.

Furthermore, through a second path $C_2$, the electrode 101 is reached via the distal end portion 22a, the flange portion 22b, the boss portion 22c, the proximal end portion 22d, the slide portion 22e, the pipe 24, the slide portion 21e, the proximal end portion 21d, the boss portion 21c, the flange portion 21b, and the distal end portion 21a.

In addition, there are, for example: another path through which the electrode 101 is reached via the distal end portion 22a, the flange portion 22b, the second attachment portion 23b, the second contact portion 23d, the pipe 24, the slide portion 21e, the proximal end portion 21d, the boss portion 21c, the flange portion 21b, and the distal end portion 21a; and yet another path through which the electrode 101 is reached via the distal end portion 22a, the flange portion 22b, the boss portion 22c, the proximal end portion 22d, the slide portion 22e, the pipe 24, the first contact portion 23c, the first attachment portion 23a, the flange portion 21b, and the distal end portion 21a.

In the embodiment described above, a signal is able to be electrically conducted via any of the plural paths including the first path $C_1$ through which the first plunger 21 is reached via the pipe 24 and the tightly wound portions of the coil spring 23 and the second path $C_2$ through which the first plunger 21 is reached via the pipe 24 and the slide portions of the plungers, the plural paths serving as conduction paths for a signal electrically conducted through the probe 2. For example, even if the contact between the first contact portion 23c and the pipe 24 and between the second contact portion 23d and the pipe 24 in the first path $C_1$ is unstable, a signal is able to be transmitted via the second path $C_2$, and as a result, the signal is able to be electrically conducted in the probe 2 stably.

Furthermore, in the embodiment described above, the slide portions 21e and 22e move along the inner peripheral surface of the pipe 24 and thus are highly capable of moving in a straight line when the probe 2 expands and contracts. As described above, as the probes 2 are highly capable of moving in straight lines, the plungers are able to be prevented from being inclined with respect to the axes of the probes 2 at the time of testing.

In the embodiment described above, the diameters of the proximal end portion 21d and the slide portion 21e may be made the same. Similarly, the diameters of the proximal end portion 22d and the slide portion 22e may be made the same. In that case, for example, the proximal end portion 21d and the slide portion 21e form a cylindrical shape having a uniform diameter.

Modified Example

Figure 5:
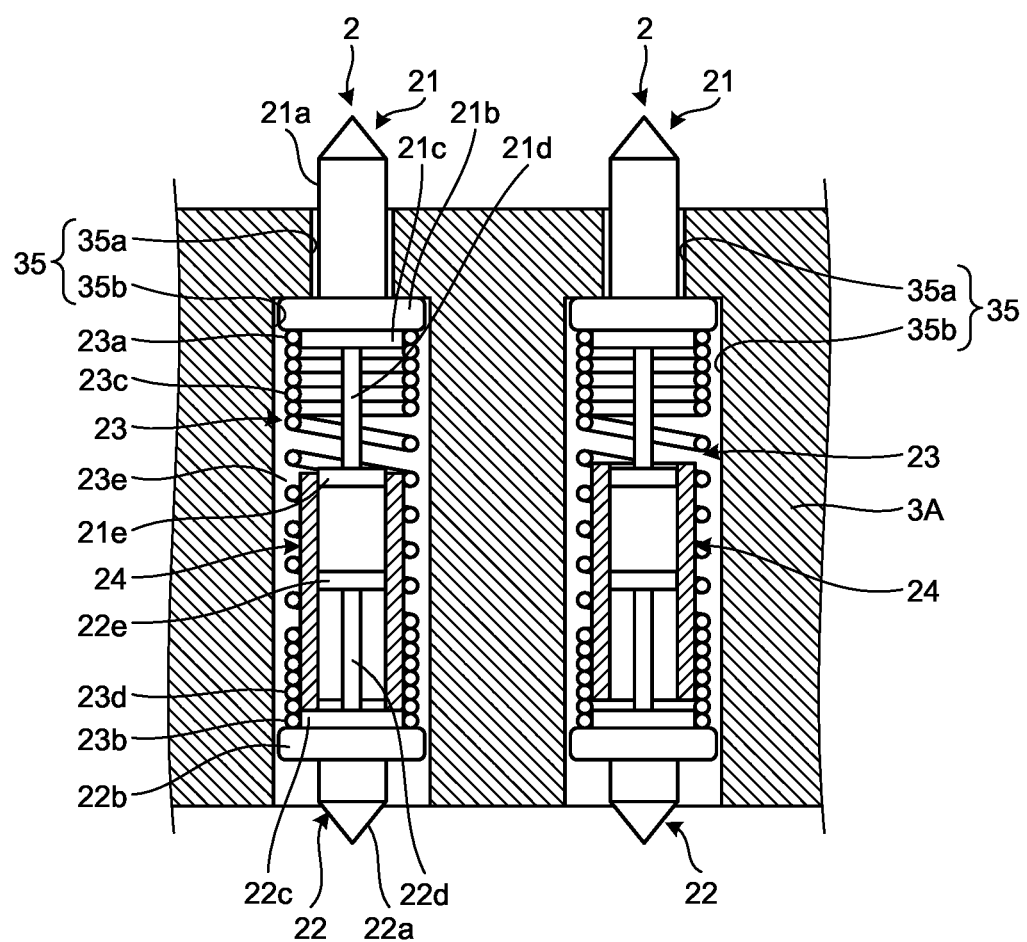
FIG. 5 is a partial sectional view illustrating a configuration of main parts of a probe unit according to a modified example of the embodiment of the present invention.

Next, a modified example of the embodiment will be described by reference to FIG. 5. FIG. 5 is a partial sectional view illustrating a configuration of main parts of a probe unit according to the modified example of the embodiment of the present invention. According to the above description of the embodiment, the holder hole 34 that comes into contact with the second plunger 22 and has a stepped shape is formed, but a stepped portion may be not provided in the hole near the second plunger 22 as long as a configuration preventing the second plunger 22 from falling off is adopted, by, for example, setting the circuit board 200 onto the hole. In this case, a single probe holder 3A formed using an insulating material, such as resin, machinable ceramic, or silicone, is used in the configuration.

Holder holes 35 for housing the plural probes 2 are formed in the probe holder 3A. The holder holes 35 penetrate the probe holder 3A in one direction. The holder holes 35 each have a stepped hole shape that differs, along the penetrating direction, in diameter near an end of the holder hole 35, the end being where the first plunger 21 protrudes from the holder hole 35. That is, the holder hole 35 is formed of: a small diameter portion 35a having an opening at an upper end surface of the probe holder 3; and a large diameter portion 35b having a diameter larger than that of this small diameter portion 35a. At an end portion of the large diameter portion 35b, the large diameter portion 35b has an opening formed at a lower end surface, the end portion being opposite to an end of the large diameter portion 35b, the end being connected with the small diameter portion 35a.

The above described modified example may have a configuration in which the diameter of the distal end portion 22a is made the same as the diameter of the flange portion 22b and the distal end portion 22a and the flange portion 22b are integrated together.

As described above, the present invention may include various embodiments and the like not described herein, and various design changes and the like may be made without departing from the technical ideas defined by the claims.

INDUSTRIAL APPLICABILITY

As described above, a contact probe and a signal transmission method according to the present invention are suitable for stable electric conduction of signals in contact probes.

REFERENCE SIGNS LIST

1 PROBE UNIT
2 CONTACT PROBE (PROBE)
3, 3A PROBE HOLDER
21 FIRST PLUNGER
21a, 22a DISTAL END PORTION
21b, 22b FLANGE PORTION
21c, 22c BOSS PORTION
21d, 22d PROXIMAL END PORTION
21e, 22e SLIDE PORTION
22 SECOND PLUNGER
23 COIL SPRING
24 PIPE
23a FIRST ATTACHMENT PORTION
23b SECOND ATTACHMENT PORTION
23c FIRST CONTACT PORTION
23d SECOND CONTACT PORTION
23e ROUGHLY WOUND PORTION
31 FIRST PART
32 SECOND PART
33, 34, 35 HOLDER HOLE
33a, 34a, 35a SMALL DIAMETER PORTION
33b, 34b, 35b LARGE DIAMETER PORTION
100 SEMICONDUCTOR INTEGRATED CIRCUIT
101, 201 ELECTRODE
200 CIRCUIT BOARD

The invention claimed is:

1. A contact probe for contacting with electrodes at both ends of a longitudinal length of the contact probe and transmitting a signal, the contact probe comprising:
   a first plunger configured to contact a first electrode at one end of the longitudinal length;
   a second plunger configured to contact a second electrode different from the first electrode at another end of the longitudinal length;
   a coil spring connected to the first plunger at one end of the coil spring and connected to the second plunger at another end of the coil spring; and
   a pipe provided inside the coil spring, wherein
   the first plunger includes a first slide portion provided at another end of the first plunger opposite to the one end of the first plunger contacting the first electrode, the first slide portion being configured to slide along an inner periphery of the pipe,
   the second plunger includes a second slide portion provided at another end of the second plunger opposite to the one end of the second plunger contacting the second electrode, the second slide portion being configured to slide along the inner periphery of the pipe, and
   the coil spring includes:

a first attachment portion that is tightly wound, the first attachment portion being provided at the one end of the coil spring and attached to the first plunger;

a second attachment portion that is tightly wound, the second attachment portion being provided at the other end of the coil spring and attached to the second plunger;

a coarsely wound portion wound at preset pitches;

a first contact portion including one end connected to the first attachment portion and another end connected to the coarsely wound portion, the first contact portion contacting the pipe, the first contact portion being tightly wound in a natural state; and a second contact portion including one end connected to the coarsely wound portion and another end connected to the second attachment portion, the second contact portion contacting the pipe, the second contact portion being tightly wound in the natural state.

2. The contact probe according to claim 1, wherein in a natural state where no load other than gravity is being applied to the contact probe, the first slide portion and the second slide portion are positioned inside the pipe regardless of a position of the pipe along an axial direction of the contact probe.

3. A signal transmission method for transmitting a signal, via the contact probe according to claim 1, from the second electrode to the first electrode, the signal transmission method comprising transmitting the signal input from the second electrode to the second plunger to the first electrode via at least one of:

a first path through which the signal reaches the first electrode via the second attachment portion, the second contact portion, the pipe, the first contact portion, and the first attachment portion; and a second path through which the signal reaches the first electrode via the second slide portion, the pipe, and the first slide portion.

4. The contact probe according to claim 1, wherein a part of the coarsely wound portion connected to the first contact portion or to the second contact portion becomes tightly wound as a load applies to the contact probe, and the part of the coarsely portion functions as the first contact portion or the second contact portion.

* * * * *